(12) United States Patent
Takahashi et al.

(10) Patent No.: US 7,771,627 B2
(45) Date of Patent: Aug. 10, 2010

(54) CONDUCTIVE COMPOSITION

(75) Inventors: Katsuhiko Takahashi, Sakura (JP); Kiwako Ohmori, Sakura (JP); Masanori Endo, Sakura (JP); Hikaru Yasuhara, Tokyo (JP); Takayuki Imai, Sakura (JP); Akinobu Ono, Tokyo (JP); Toshiyuki Honda, Kitakatsushika-gun (JP); Koji Okamoto, Kitakatsushika-gun (JP); Masafumi Ito, Kitakatsushika-gun (JP)

(73) Assignees: Fujikura Ltd., Tokyo (JP); Fujikura Kasei Co., Ltd., Tokyo (JP)

( * ) Notice: Subject to any disclaimer, the term of this patent is extended or adjusted under 35 U.S.C. 154(b) by 493 days.

(21) Appl. No.: 10/510,512

(22) PCT Filed: Apr. 9, 2003

(86) PCT No.: PCT/JP03/04514

§ 371 (c)(1),
(2), (4) Date: Oct. 7, 2004

(87) PCT Pub. No.: WO03/085052

PCT Pub. Date: Oct. 16, 2003

(65) Prior Publication Data

US 2005/0116203 A1    Jun. 2, 2005

(30) Foreign Application Priority Data

Apr. 10, 2002   (JP) .............................. 2002-108178

(51) Int. Cl.
    *H01B 1/20* (2006.01)
(52) U.S. Cl. ..................................... 252/520.2; 252/514
(58) Field of Classification Search ................. 252/500, 252/512, 514; 106/1.13, 1.14, 1.18, 1.19; 427/123, 125, 96.1; 428/357, 901; 75/255; 977/773, 775, 777
    See application file for complete search history.

(56) References Cited

U.S. PATENT DOCUMENTS

| 4,049,844 A | * | 9/1977 | Bolon et al. ................. 427/511 |
| 4,564,563 A | | 1/1986 | Martin et al. |
| 4,877,512 A | | 10/1989 | Bowns et al. |
| 5,098,771 A | * | 3/1992 | Friend ......................... 428/209 |
| 5,488,082 A | * | 1/1996 | Dietz et al. .................. 524/403 |
| 5,503,777 A | * | 4/1996 | Itagaki et al. ........... 252/519.21 |
| 5,882,722 A | * | 3/1999 | Kydd ......................... 427/98.4 |
| 6,121,359 A | | 9/2000 | Fujiki et al. |
| 6,406,646 B1 | * | 6/2002 | Lee et al. ..................... 252/514 |
| 7,141,185 B2 | * | 11/2006 | Conaghan et al. ............ 252/514 |
| 2003/0124259 A1 | * | 7/2003 | Kodas et al. ............. 427/376.6 |
| 2003/0148024 A1 | * | 8/2003 | Kodas et al. ................. 427/125 |
| 2004/0144958 A1 | * | 7/2004 | Conaghan et al. ........... 252/500 |

FOREIGN PATENT DOCUMENTS

| JP | 57-4030 A | 1/1982 |
| JP | 57-19903 A | 2/1982 |
| JP | 60-15474 A | 1/1985 |
| JP | 60-88027 A | 5/1985 |
| JP | 63-86205 A | 4/1988 |
| JP | 04-031463 A | 2/1992 |
| JP | 4-31463 A2 | 2/1992 |
| JP | 6-13756 A | 1/1994 |
| JP | 10-100168 A | 4/1998 |
| JP | 10-106350 A | 4/1998 |
| JP | 2002-117720 A | 4/2002 |

OTHER PUBLICATIONS

Composite Materials, Handbook of Biomaterial Properties, Jonathan Black, Table 2.29, 1998.*

* cited by examiner

*Primary Examiner*—Stanley Silverman
*Assistant Examiner*—Kallambella Vijayakumar
(74) *Attorney, Agent, or Firm*—Sughrue Mion, PLLC

(57) ABSTRACT

A conductive composition capable of producing a conductive coating with excellent flexibility and a high conductivity comparable to that of metallic silver, without using high temperatures as film forming conditions. The conductive composition includes a particulate silver compound and a binder, and optionally a reducing agent and a binder. Silver oxide, silver carbonate and silver acetate and the like are used as the particulate silver compound. Ethylene glycol, diethylene glycol, and ethylene glycol diacetate and the like are used as the reducing agent, and a fine powder of a thermosetting resin such as a polyvalent phenol compound, phenol resin, alkyd resin or polyester resin, or a thermoplastic resin such as a styrene resin or polyethylene terephthalate, with an average particle diameter from 20 nm to 5 μm is used as the binder. Furthermore, the average particle diameter of the particulate silver compound may be from 0.01 to 10 μm.

1 Claim, No Drawings

CONDUCTIVE COMPOSITION

This is a National Stage entry of International Application PCT/JP03/04514, with an international filing date of Apr. 9, 2003, which was published under PCT Article 21(2) in Japanese, and the disclosure of which is incorporated herein by reference. Further, International Application PCT/JP03/04514 is based on Japanese Patent Application No. 2002-108178, filed in Japan on Apr. 10, 2002, the disclosure of which is incorporated herein by reference.

TECHNICAL FIELD

The present invention relates to a conductive composition for use as a conductive paste, a conductive paint, or a conductive adhesive or the like, a method of forming a conductive paint using this conductive composition, and a conductive paint obtained by this formation method, wherein the conductivity of the obtained conductive film is significantly enhanced, so that the conductivity thereof becomes close to that of metallic silver.

BACKGROUND ART

A representative example of conventional conductive pastes is silver paste, obtained by mixing flake-like silver particles with, for example, a binder composed of a thermoplastic resin such as an acrylic resin or polyvinyl acetate, or a thermosetting resin such as an epoxy resin or a polyester resin, as well as a solvent, a curing agent, and a catalyst and the like.

This silver paste is used widely as a conductive adhesive and a conductive paint in various electronic equipment, electronic components and electronic circuits. Furthermore, flexible circuit boards with electrical circuits formed by printing this silver paste, using a screen printing method, onto a plastic film such as a polyethylene terephthalate film, can be used as printed circuit boards in keyboards and various switches and the like.

When used, this silver paste is applied to the target using any of various devices, and either allowed to dry at room temperature or heated to approximately 120° C., to form a conductive paint.

The volume resistivity of a conductive paint formed in this manner varies depending on the film forming conditions, but is typically within a range from $10^{-5}$ to $10^{-4}$ $\Omega \cdot$cm, which is 10 to 100 times the volume resistivity of metallic silver at $1.6 \times 10^{-6}$ $\Omega \cdot$cm, and as such, the conductivity of such a conductive paint is nowhere near that of metallic silver.

Included amongst the reasons that this conductivity is so low are the fact that within a conductive paint obtained from silver paste, only a portion of the silver particles are in physical contact, and so there is a low number of contact points, the fact that there is contact resistance at the contact points, and the fact that the binder remains positioned between some of the silver particles, and this binder inhibits direct contact between the silver particles.

One way of improving this low conductivity is to apply the silver paste to the target, and then heat the target to approximately 800° C., thus removing the binder by heat while melting the silver particles, so that the silver particles fuse and form a uniformly continuous metallic silver coating. The volume resistivity of a conductive paint formed in this manner is approximately $10^{-6}$ $\Omega \cdot$cm, giving the coating similar conductivity to metallic silver.

However, with such a method, the target is limited to heat resistant materials such as glass, ceramics and enamel which can withstand heating at high temperatures.

Furthermore, with the flexible circuit boards mentioned above, the line width of the electrical circuits formed on these circuit boards is required to be as narrow as possible, but with conventional silver pastes, because the silver particles are in flake form with a particle diameter of 50 to 100 μm, it is theoretically impossible to print at a line width narrower than the particle size of the flaked silver particles.

Moreover, it is also a requirement that even with the narrowed line width of the electrical circuit, sufficient conductivity must still be provided, and in order to satisfy this requirement, the electrical circuit needs to be considerably thick. However, thicker electrical circuits are difficult to deposit a film, and there is an additional disadvantage in that the flexibility of the electrical circuit itself is also greatly reduced.

Accordingly, an object of the present invention is to provide a conductive composition capable of producing a conductive paint with a low volume resistivity and a high conductivity comparable to that of metallic silver, without depending on high temperature film forming conditions, and which when forming electrical circuits on a flexible circuit board or the like, can be formed with a sufficiently narrow line width, without needing to be formed overly thickly.

DISCLOSURE OF INVENTION

In order to achieve this object, a conductive composition of the present invention comprises a particulate silver compound and a binder. Furthermore, the conductive composition of the present invention may comprise a particulate silver compound, a reducing agent and a binder. As the particulate silver compound, one or more of silver oxide, silver carbonate and silver acetate is used. The average particle diameter of this particulate silver compound is within a range from 0.01 μm to 10 μm.

As the binder, one or more of a polyvalent phenol compound, phenol resin, alkyd resin, polyester resin and epoxy resin can be used. This binder may also exhibits a reducing action. In addition, a fine powder of a thermoplastic resin such as polystyrene or polyethylene terephthalate with an average particle diameter within a range from 20 nm to 5 μm may also be used as the binder.

As the reducing agent, one or more of ethylene glycol, diethylene glycol, triethylene glycol and ethylene glycol diacetate can be used.

The viscosity of the conductive composition of the present invention is within a range from 30 to 300 dPa·sec.

A method of forming a conductive coating of the present invention comprises the steps of applying the conductive composition, and performing heating, may be at a temperature within a range from 140 to 200° C.

A conductive coating of the present invention is obtained by the above formation method, wherein the silver particles are fused together, and the volume resistivity may be no more than $3.0 \times 10^{-5}$ $\Omega \cdot$cm.

BEST MODE FOR CARRYING OUT THE INVENTION

A detailed description of the invention follows.

The particulate silver compound used in a conductive composition of the present invention is a solid particulate compound which reduces to become metallic silver under simple heating, or heating in the presence of a reducing agent.

Silver oxide, silver carbonate and silver acetate are specific examples of such a particulate silver compound. A mixture of two or more of these compounds may also be used. An industrially produced particulate silver compound can be used as-is, used following classification, or used following grinding and subsequent classification. Furthermore, a particulate silver compound obtained by the liquid phase method mentioned below may also be used.

The average particle diameter of this particulate silver compound is within a range from 0.01 to 10 µm, and can be selected appropriately in accordance with the conditions of the reduction reaction, for example, the heating temperature, the presence of a reducing agent, and the reducing power of the reducing agent. The use of a particulate silver compound with an average particle diameter of no more than 0.5 µm provides a particularly fast reduction reaction, which is preferable. Furthermore, a particulate silver compound with an average particle diameter of no more than 0.5 µm can be produced by a liquid phase method in which a silver compound and another compound are reacted together, for example, a method in which silver nitrate and an alkali such as sodium hydroxide are reacted together to form silver oxide. In this case, a dispersion stabilizer may be added to the solution to prevent coagulation of the precipitated particulate silver compound.

Furthermore, it is possible to obtain a particulate silver compound with an average particle diameter of no more than 0.1 µm by performing centrifugation of the dispersion liquid obtained by the above liquid phase method, and trapping the particles which have an average particle diameter within a range from 0.01 to 0.1 µm. The conditions of centrifugation may include 40,000 revolutions or more, and a time of approximately 30 minutes, for example.

The binder used in the present invention protects the obtained conductive paint, while providing flexibility, and therefore has a different function from the binders blended with conventional conductive pastes.

Examples of suitable binders include one or more resins selected from a group consisting of polyvalent phenol compounds, phenol resins, alkyd resins, polyester resins and epoxy resins.

Furthermore, the binder may be a resin or compound from the above group which either itself exhibits a reducing action, or has oxidation polymerization properties, so that during heating, it reduces the particulate silver compound while undergoing polymerization itself. By choosing such a binder, the quantity of reducing agent added can be reduced, or alternatively, the need for a reducing agent may be eliminated altogether. Examples of binders which have such a reducing effect are polyvalent phenol compounds, phenol resins and alkyd resins.

When using a thermosetting resin which does not have oxidation polymerization properties, an uncured resin and a curing agent or catalyst for curing the resin are used.

In addition, a fine powder of a thermoplastic resin, for example polystyrene or polyethylene terephthalate, with an average particle diameter within a range from 20 nm to 5 µm, can also be used as the binder, in powder form.

When a binder formed from such a fine powder of a thermoplastic resin is used, the powder melts under the heat generated during heating, and fills the gaps between the silver coating produced when the particulate silver compound is reduced, and the surface of the target. This improves the adhesion of the produced conductive paint.

The quantity of binder used relative to 100 parts by weight of the particulate silver compound is typically within a range from 0.2 to 10 parts by weight, and may be from 0.5 to 5 parts by weight. At quantities less than 0.2 parts by weight, there is no blending effect, whereas if the quantity exceeds 10 parts by weight, then the resistance of the obtained conductive coating increases.

The reducing agent used in the present invention reduces the particulate silver compound mentioned above, and may generates a gas or a highly volatile liquid as the by-product of the reduction reaction, which does not remain within the produced conductive coating. Specific examples of reducing agents with such properties include one or more of ethylene glycol, diethylene glycol, triethylene glycol and ethylene glycol diacetate.

The quantity of reducing agent used relative to 1 mol of the particulate silver compound is typically no more than 20 mol, and preferably may be within a range from 0.5 to 10 mols, and may be from 1 to 5 mols. Taking the reaction efficiency and the volatilization caused by the heating process into consideration, quantities exceeding an equimolar quantity are preferred, but any reducing agent added in excess of a maximum 20 mols is wasted.

Furthermore, a dispersion medium is used to disperse or dissolve the particulate silver compound and the binder, or the particulate silver compound, the reducing agent and the binder, thus producing a liquid conductive composition. Dispersion media which can be used include alcohols such as methanol, ethanol and propanol, as well as isophorone, terpineol, triethylene glycol monobutyl ether, and butyl cellosolve acetate and the like.

Furthermore, if the reducing agent is in liquid form, and is capable of dispersing or dissolving the particulate silver compound and the binder, then the reducing agent may also function as the dispersion medium, and an example of a reducing agent with such properties is ethylene glycol.

The choice of dispersion medium and the quantity used differ depending on the particulate silver compound, the binder, and the film forming conditions, for example, when screen printing, factors such as the size of the mesh of the press plate used or the fineness of the printing pattern, and can be adjusted appropriately for optimum film forming.

Furthermore, when added, the dispersion medium preferably may favorably disperses the particulate silver compound with an average particle diameter of no more than 1 µm, thus preventing secondary aggregation of the particulate silver compound. Examples of such a dispersion medium are hydroxypropyl cellulose, polyvinylpyrrolidone and polyvinyl alcohol, and the quantity used is typically within a range from 0 to 300 parts by weight relative to 100 parts by weight of the particulate silver compound.

In a first example of a conductive composition of the present invention, the particulate silver compound and the binder described above are dispersed in a dispersion medium. Furthermore, a dispersant may also be added according to need. The particulate silver compound used in this example may have a small average particle diameter of no more than 1 µm, as this allows the reduction reaction to proceed faster.

Furthermore, the viscosity of the conductive composition in this example varies depending on the film forming conditions, and in the case of screen printing for example, may be within a range from approximately 30 to approximately 300 dPa·sec. Furthermore, the method of using the conductive composition of this example involves simply applying the conductive composition to the target using appropriate means, and then heating the resulting structure. The heating temperature is typically within a range from 180 to 200° C., and the heating time is from approximately 10 seconds to approximately 180 minutes.

In a second example of a conductive composition of the present invention, a particulate silver compound, a reducing agent and a binder are dispersed or dissolved in a dispersion medium. In this example, as with the first example, a dispersant may be added as needed. The average particle diameter of the particulate silver compound used in this example need not be small, and there are no particular restrictions provided the average particle diameter is within a range from 0.01 to 10 μm, as the presence of the reducing agent means the reduction reaction proceeds smoothly even with particles greater than 1 μm.

Furthermore, the viscosity of the conductive composition of this example also varies depending on the film forming conditions, and in the case of screen printing for example, may be within a range from approximately 30 to approximately 300 dPa·sec.

The method of using the conductive composition of this example involves simply applying the conductive composition to the target using appropriate means, and then heating the resulting structure. Due to the presence of the reducing agent, the heating temperature can be lower than the previous example, and is typically within a range from 140 to 160° C., and the heating time is from approximately 10 seconds to approximately 180 minutes.

In either example, it is of course necessary for the surface of the target to be clean.

In the conductive paint of the present invention obtained in this manner, the reaction heat generated when the particulate silver compound is reduced causes the precipitated metallic silver particles to melt and fuse together, thus forming a continuous thin coating of metallic silver.

Furthermore, because the binder either fills the gaps in the woven structure of the silver particles, or covers the surface of the coating, or fills in the gaps in the silver coating and the target surface, the addition of the binder does not cause the volume resistivity of the obtained conductive paint to increase. Furthermore, the presence of the binder protects the surface of the conductive paint, improves the mechanical strength, has a favorable effect on the flexibility of the coating itself, and produces a coating with good adhesion to the substrate.

Consequently, the value of the volume resistivity of a conductive coating of the present invention falls within a range from $3 \times 10^{-6}$ Ω·cm to $8 \times 10^{-6}$ Ω·cm, which is approximately the same volume resistivity as metallic silver.

Furthermore, because the average particle diameter of the particulate silver compound is within a range from 0.01 to 10 μm, a line width of less than 10 μm can be achieved for an electrical circuit formed by printing the conductive composition onto a substrate, and because the conductivity of the circuit itself is extremely high, there is no need to increase the thickness of the circuit. As a result, circuits can be formed easily, and the circuits themselves are highly flexible.

In addition, because temperatures of between 180 and 200° C. or between 140 and 160° C. are sufficient as the heating temperature used when forming the conductive paint, the coating can be applied to target objects with low heat resistance such as plastic films, and a highly conductive paint can be formed without causing heat deterioration of the target object.

In addition, because the volume resistivity of the obtained conductive paint is extremely low, adequate conductivity can be obtained even when the coating is extremely thin, and even coatings with thickness values of approximately 0.1 μm are feasible. Furthermore, the surface of the obtained conductive paint presents a metallic silver mirrored surface with good luster, and is therefore suitable for use in household and industrial applications as a highly reflective mirror, and can be used, for example, as the reflecting mirror in the resonator of a laser device.

The following provides a description of specific examples. However, although the invention will be explained below in more detail by reference to the following Examples, the invention should not be construed as being limited to the following Examples only. It is to be expressly understood, that the Examples are for purpose of illustration only and are not intended as a definition of the limits of the invention.

Example 1

An aqueous solution was prepared by dissolving 0.17 g of silver nitrate in 50 ml of ion exchange water, and then dissolving between 0.05 and 0.5 g of hydroxypropyl cellulose (a dispersant) in the resulting solution. 0.9 to 5 ml of a 1 M aqueous solution of sodium hydroxide was then added dropwise to this aqueous solution with constant stirring, and the resulting solution was stirred for 10 to 30 minutes to form a silver oxide suspension.

Subsequently, the silver oxide was washed several times using methanol to remove excess ions, thus yielding an aqueous dispersion of silver oxide with a particle diameter of no more than 0.5 μm.

A binder and a reducing agent were then added to this dispersion to prepare a conductive composition in the form of a paste.

The following four types of binder were used.

B-1: A powder of a phenol resin 4,4'-((2-hydroxyphenyl)methylene)bis(2-methylphenol) with an average particle size of no more than 20 μm was used. This resin has a melting point of 141° C., undergoes oxidation polymerization readily, causing the reduction of the particulate silver compound to proceed effectively, while undergoing an increase in molecular weight itself.

B-2: A phenol resin, a powder with an average particle diameter of no more than 20 μm, which has a reducing effect on the particulate silver compound.

B-3: A powder was used, comprising an epoxy resin "YDC1312" (melting point 138 to 145° C., epoxy equivalence 170 to 185) manufactured by Toto Kasei Co., Ltd. as the main component, mixed with diaminodiphenylmethane (melting point 89° C., amine value 49.6) as a curing agent, and ground up to an average particle diameter of no more than 20 μm.

B-4: An alkyd resin "Hariphthal SL-280" (type of oil: linseed oil in liquid form) manufactured by Harima Chemicals, Inc. was used. This resin has oxidation polymerization properties, and enables reduction of the particulate silver compound and polymerization of the resin itself to proceed simultaneously.

The quantity of binder added was constant, at 0.78 parts by weight per 100 parts by weight of the silver oxide particles solid fraction.

Ethylene glycol was used as the reducing agent, and the quantity added was expressed in parts by weight relative to 100 parts by weight of the silver oxide particles solid fraction.

A pattern with a width of 5 mm, a length of 50 mm and a thickness of 3 to 8 μm was formed using each conductive composition, by screen printing onto a polyethylene terephthalate film with a thickness of 0.1 mm, and the resulting product was then heated for 0.5 to 3 hours in an oven at 150° C.

The volume resistivity of each obtained conductive film was measured, and the state of the surface was observed using a scanning electron microscope.

In addition, for comparison, the results are also shown when using a commercially available silver paste ("FA-353" made by Fujikura Kasei Co., Ltd.).

The results are shown in Table 1.

TABLE 1

|  | Test number | | | | |
| --- | --- | --- | --- | --- | --- |
|  | 1-1 | 1-2 | 1-3 | 1-4 | 1-5 |
| Binder type | B-1 | B-2 | B-3 | B-4 | Commercially available paste |
| Quantity of reducing agent added | — | 75 | 75 | — |  |
| Volume resistivity ($\Omega \cdot cm$) | No more than $9 \times 10^{-6}$ | No more than $9 \times 10^{-6}$ | No more than $9 \times 10^{-6}$ | No more than $2 \times 10^{-5}$ | At least $4 \times 10^{-5}$ |
| Presence of fusion between silver particles | yes | yes | yes | partial | no |

From the results in Table 1 it is apparent that each of the conductive compositions in tests 1-1 through 1-4 produces a favorable conductive paint with a low volume resistivity compared to the commercially available silver paste.

Example 2

Silver oxide with a variety of different average particle diameters, produced using the liquid phase method of Example 1, was used as the particulate silver compound, and to this silver oxide was added ethylene glycol as the reducing agent, at a ratio of 75 parts by weight per 100 parts by weight of the silver oxide particle solid fraction, and a fine powder of polystyrene (PS) or polyethylene terephthalate (PET) with one of a variety of average particle diameters as the binder, at a ratio of between 0.78 and 2.36 parts by weight per 100 parts by weight of the silver oxide particle solid fraction, thus producing a conductive composition in the form of a paste.

A pattern with a width of 5 mm, a length of 50 mm and a thickness of 3 to 8 μm was formed using each conductive composition, by screen printing onto a polyethylene terephthalate film with a thickness of 0.1 mm, and the resulting product was then heated for 0.5 to 3 hours in an oven at 150° C.

The volume resistivity of each obtained conductive film was measured, and the state of the surface was observed using a scanning electron microscope.

The results are shown in Table 2-A and Table 2-B.

TABLE 2-A

|  | Test number | | | | |
| --- | --- | --- | --- | --- | --- |
|  | 2-1 | 2-2 | 2-3 | 2-4 | 2-5 |
| Average particle diameter of silver oxide (μm) | 0.25 | 0.25 | 0.25 | 0.25 | 1.5 |
| Binder type | PS | PS | PS | PS | PS |
| Average particle diameter | 28 nm | 28 nm | 28 nm | 200 nm | 200 nm |
| Quantity added (parts by weight) | 0.78 | 1.57 | 2.36 | 0.78 | 1.57 |
| Volume resistivity ($\Omega \cdot cm$) | $6.0 \times 10^{-6}$ to $1.0 \times 10^{-5}$ | $7.0 \times 10^{-6}$ to $1.3 \times 10^{-5}$ | $8.0 \times 10^{-6}$ to $1.9 \times 10^{-5}$ | $6.0 \times 10^{-6}$ to $1.0 \times 10^{-5}$ | $7.0 \times 10^{-6}$ to $1.3 \times 10^{-5}$ |
| Presence of fusion between silver particles | yes | yes | yes | yes | yes |

TABLE 2-B

|  | Test number | | | | |
| --- | --- | --- | --- | --- | --- |
|  | 2-6 | 2-7 | 2-8 | 2-9 | 2-10 |
| Average particle diameter of silver oxide (μm) | 5 | 10 | 0.25 | 1.5 | 5 |
| Binder type | PS | PS | PS | PET | PET |
| Average particle diameter | 200 nm | 20 nm 50% 200 nm 50% | 200 nm | 1 μm | 1 μm |
| Quantity added (parts by weight) | 2.36 | 1.57 | 0.78 | 1.57 | 2.36 |
| Volume resistivity ($\Omega \cdot cm$) | $8.0 \times 10^{-6}$ to $1.9 \times 10^{-5}$ | $7.5 \times 10^{-5}$ to $1.5 \times 10^{-5}$ | $6.0 \times 10^{-6}$ to $1.0 \times 10^{-5}$ | $8.0 \times 10^{-6}$ to $1.4 \times 10^{-5}$ | $8.8 \times 10^{-6}$ to $2.0 \times 10^{-5}$ |
| Presence of fusion between silver particles | yes | yes | yes | yes | yes |

From the results in Table 2-A and Table 2-B it is apparent that each of the tests 2-1 through 2-10 produces a favorable conductive paint with a low volume resistivity compared to the commercially available silver paste.

Example 3

Silver oxide with a variety of different average particle diameters, produced using the liquid phase method of Example 1, was used as the particulate silver compound, and to this silver oxide was added a total of 75 parts by weight of a reducing agent comprising either one or two of ethylene glycol (EG), diethylene glycol (DEG), triethylene glycol (TEG) and ethylene glycol diacetate (EGDA) per 100 parts by weight of the silver oxide particle solid fraction. In addition, B-1 from Example 1 was added as a binder, at a ratio of 1.1 parts by weight per 100 parts by weight of the silver oxide particle solid fraction, thus producing a conductive composition in the form of a paste.

A pattern with a width of 5 mm, a length of 50 mm and a thickness of 3 to 8 μm was formed using each conductive composition, by screen printing onto a polyethylene terephthalate film with a thickness of 0.1 mm, and the resulting product was then heated for 0.5 to 3 hours in an oven at 150° C.

The volume resistivity of each obtained conductive film was measured, and the state of the surface was observed using a scanning electron microscope.

The results are shown in Table 3.

TABLE 3

| | Test number | | | | | |
|---|---|---|---|---|---|---|
| | 3-1 | 3-2 | 3-3 | 3-4 | 3-5 | 3-6 |
| Average particle diameter of silver oxide (μm) | 0.25 | 0.25 | 0.25 | 1.5 | 5 | 0.25 |
| EG (blending quantity) | — | — | — | 32.5 | 32.5 | — |
| DEG (blending quantity) | 75 | — | — | 32.5 | — | — |
| TEG (blending quantity) | — | 75 | — | — | 32.5 | — |
| EGDA (blending quantity) | — | — | 75 | — | — | — |
| Volume resistivity (Ω · cm) | $7.2 \times 10^{-6}$ to $9.5 \times 10^{-6}$ | $8.0 \times 10^{-6}$ to $1.6 \times 10^{-5}$ | $8.0 \times 10^{-6}$ to $1.5 \times 10^{-5}$ | $9.0 \times 10^{-6}$ to $1.3 \times 10^{-5}$ | $8.0 \times 10^{-6}$ to $1.8 \times 10^{-5}$ | $8.3 \times 10^{-6}$ to $1.7 \times 10^{-5}$ |
| Presence of fusion between silver particles | yes | yes | yes | yes | yes | yes |

From the results in Table 3 it is apparent that each of the tests 3-1 through 3-6 produces a favorable conductive paint with a low volume resistivity compared to the commercially available silver paste.

Example 4

Silver oxide with a variety of different average particle diameters, produced using the liquid phase method of Example 1, was used as the particulate silver compound, and to this silver oxide was added ethylene glycol as a reducing agent, at a ratio of 75 parts by weight per 100 parts by weight of the silver oxide particle solid fraction. In addition, B-1 from Example 1 was added as a binder, at a ratio of 1.1 parts by weight per 100 parts by weight of the silver oxide particle solid fraction, thus producing a conductive composition in the form of a paste.

A pattern with a width of 5 mm, a length of 50 mm and a thickness of 3 to 8 μm was formed using each conductive composition, by screen printing onto a polyethylene terephthalate film with a thickness of 0.1 mm, and the resulting product was then heated for 0.5 to 3 hours in an oven at 150° C.

The volume resistivity of each obtained conductive film was measured, and the state of the surface was observed using a scanning electron microscope.

The results are shown in Table 4-A and Table 4-B.

TABLE 4-A

| | Test number | | | |
|---|---|---|---|---|
| | 4-1 | 4-2 | 4-3 | 4-4 |
| Average particle diameter of silver oxide (μm) | 0.01 | 0.1 | 0.8 | 1.5 |
| Volume resistivity (Ω · cm) | $7.0 \times 10^{-6}$ to $9.0 \times 10^{-6}$ | $7.0 \times 10^{-6}$ to $9.0 \times 10^{-6}$ | $8.0 \times 10^{-6}$ to $1.2 \times 10^{-5}$ | $8.0 \times 10^{-6}$ to $1.8 \times 10^{-5}$ |
| Presence of fusion between silver particles | yes | yes | yes | yes |

TABLE 4-B

| | Test number | | |
|---|---|---|---|
| | 4-5 | 4-6 | 4-7 |
| Average particle diameter of silver oxide (μm) | 5 | 10 | 15 |
| Volume resistivity (Ω · cm) | $8.0 \times 10^{-6}$ to $1.6 \times 10^{-5}$ | $1.0 \times 10^{-5}$ to $2.0 \times 10^{-5}$ | $4.0 \times 10^{-4}$ to $6.0 \times 10^{-6}$ |
| Presence of fusion between silver particles | yes | yes | no |

From the results in Table 4-A and Table 4-B it is apparent that the conductive compositions in each of the tests 4-1 through 4-6 produces a favorable conductive paint with a low volume resistivity compared to the commercially available silver paste.

Example 5

A mixture of one, two or three materials from amongst silver oxide (average particle diameter 0.25 μm), silver acetate (average particle diameter 5 μm) and silver carbonate (average particle diameter 5 μm) was used as the particulate silver compound, and to this particulate silver compound was added ethylene glycol as a reducing agent, at a ratio of 75 parts by weight per 100 parts by weight of the particulate silver compound solid fraction. In addition, B-1 from Example 1 was added as a binder, at a ratio of 1.1 parts by weight per 100 parts by weight of the particulate silver compound solid fraction, thus producing a conductive composition in the form of a paste.

A pattern with a width of 5 mm, a length of 50 mm and a thickness of 3 to 8 μm was formed using each conductive composition, by screen printing onto a polyethylene terephthalate film with a thickness of 0.1 mm, and the resulting product was then heated for 0.5 to 3 hours in an oven at 150° C.

The volume resistivity of each obtained conductive film was measured, and the state of the surface was observed using a scanning electron microscope.

The results are shown in Table 5.

thalate film with a thickness of 0.1 mm, and the resulting product was then heated for 0.5 to 3 hours in an oven at 190° C.

The volume resistivity of each obtained conductive film was measured, and the state of the surface was observed using a scanning electron microscope.

The results are shown in Table 6.

TABLE 6

|  | Test number | |
| --- | --- | --- |
|  | 6-1 | 6-2 |
| Average particle diameter of silver oxide (μm) | 0.25 | 0.25 |
| Binder type | PS | PS |
| Average particle diameter of binder | 200 nm | 200 nm |
| Added quantity (parts by weight) | 1.57 | 2.36 |
| Volume resistivity ($\Omega \cdot cm$) | $6.0 \times 10^{-6}$ to $1.2 \times 10^{-5}$ | $7.50 \times 10^{-6}$ to $1.7 \times 10^{-5}$ |
| Presence of fusion between silver particles | yes | yes |

TABLE 5

|  | Test number | | | | | |
| --- | --- | --- | --- | --- | --- | --- |
|  | 5-1 | 5-2 | 5-3 | 5-4 | 5-5 | 5-6 |
| Silver oxide blending quantity | — | — | 50 | 50 | — | 34 |
| Silver acetate blending quantity | — | 100 | — | 50 | 50 | 33 |
| Silver carbonate blending quantity | 100 | — | 50 | — | 50 | 33 |
| Volume resistivity ($\Omega \cdot cm$) | $9.0 \times 10^{-6}$ to $2.0 \times 10^{-5}$ | $9.5 \times 10^{-6}$ to $1.0 \times 10^{-5}$ | $8.2 \times 10^{-6}$ to $9.3 \times 10^{-6}$ | $8.3 \times 10^{-6}$ to $1.0 \times 10^{-5}$ | $8.2 \times 10^{-6}$ to $1.5 \times 10^{-5}$ | $8.6 \times 10^{-6}$ to $9.6 \times 10^{-6}$ |
| Presence of fusion between silver particles | yes | yes | yes | yes | yes | yes |

From the results in Table 5 it is apparent that each of the tests 5-1 through 5-6 produces a favorable conductive paint with a low volume resistivity compared to the commercially available silver paste.

Example 6

Using silver oxide with an average particle diameter of 0.25 μm obtained according to the liquid phase method shown in Example 1 as the particulate silver compound, to this silver oxide was added ethylene glycol as a reducing agent, at a ratio of 75 parts by weight per 100 parts by weight of the silver oxide particle solid fraction. In addition, a fine powder of polystyrene (PS) with an average particle diameter of 200 nm was added as a binder, at a ratio of 1.57 to 2.36 parts by weight per 100 parts by weight of the silver oxide particle solid fraction, thus producing a conductive composition in the form of a paste.

A pattern with a width of 5 mm, a length of 50 mm and a thickness of 3 to 8 μm was formed using each conductive composition, by screen printing onto a polyethylene tereph- From the results in Table 6 it is apparent that even when the heating temperature is changed to 190° C., a favorable conductive paint with a low volume resistivity can still be obtained.

Example 7

To 100 parts by weight of silver oxide particles with an average particle diameter of 0.25 μm were added 1.57 parts by weight of a fine powder of polystyrene with an average particle diameter of 200 nm as a binder, and between 20 and 200 parts by weight of ethylene glycol (EG) per 100 parts by weight of the silver oxide as a reducing agent, thus producing five conductive compositions with viscosities varying from 0.5 to 400 dPa·sec.

Using each of these conductive compositions, a spiral pattern with a line width of 0.4 mm×100 cm was screen printed onto a polyethylene terephthalate film.

The printed pattern was observed for bleeding, and inspected for clogging of the mesh.

The press plate conditions included a Tetron (registered trademark) 250 mesh and an emulsion thickness of 15 μm.

The results are shown in Table 7.

TABLE 7

|  | Test number | | | | |
| --- | --- | --- | --- | --- | --- |
|  | 7-1 | 7-2 | 7-3 | 7-4 | 7-5 |
| Average particle diameter of silver oxide (μm) | 0.25 | 0.25 | 0.25 | 0.25 | 0.25 |
| Binder type | PS | PS | PS | PS | PS |
| Average particle diameter of binder | 200 nm | 200 nm | 200 nm | 200 nm | 200 nm |
| Quantity of silver oxide added (parts by weight) | 100 | 100 | 100 | 100 | 100 |
| Quantity of binder added (parts by weight) | 1.57 | 1.57 | 1.57 | 1.57 | 1.57 |
| Quantity of reducing agent (EG) added (parts by weight) | 200 | 150 | 75 | 40 | 20 |
| Viscosity (dPa·sec) | 0.5 | 30 | 130 | 280 | 400 |
| Bleeding in printed pattern | yes | ○ | ○ | ○ | Mesh clogging |

From the results in Table 7 it is apparent that with the conductive compositions in the tests 7-2 through 7-4, a favorable printed pattern was obtained, and there was no clogging of the mesh. From these results it is clear that a viscosity range from 30 to 300 dPa·sec is preferable.

As described above, a conductive composition of the present invention allows a conductive paint with extremely high conductivity to be obtained. Furthermore, because the conductive paint is formed by heating at a comparatively low temperature, the coating can be applied to target objects with low heat resistance, such as plastics. In addition the conductive paint has high flexibility, and also exhibits excellent adhesion to the target object. When an electrical circuit is formed from this conductive composition, the line width of the electrical circuit can be sufficiently narrow, without needing to be formed overly thickly.

INDUSTRIAL APPLICABILITY

Although the above exemplary embodiments of the present invention have been described, it will be understood by those skilled in the art that the present invention should not be limited to the described exemplary embodiments, but that various changes and modifications can be made within the spirit and scope of the present invention.

A conductive composition according to the present invention is used as a conductive paste, a conductive paint or a conductive adhesive or the like. Furthermore, this conductive composition can also be used to form the electrical circuits on printed wiring boards such as flexible printed circuit boards. In addition, a conductive paint of the present invention can also be used as a reflective thin film with a high reflectance.

What is claimed is:

1. A conductive composition consisting of
a particulate silver compound and
a binder,
wherein the quantity of said binder used relative to 100 parts by weight of said particulate silver compound is within a range of from 0.78 to 2.36 parts by weight, and
wherein the particulate silver compound is one or more of silver oxide, silver carbonate and silver acetate.

* * * * *